US010121656B2

(12) United States Patent
Chen et al.

(10) Patent No.: US 10,121,656 B2
(45) Date of Patent: Nov. 6, 2018

(54) BUFFER LAYERS HAVING COMPOSITE STRUCTURES

(71) Applicant: Xiamen Changelight Co., Ltd., Xiamen (CN)

(72) Inventors: Kaixuan Chen, Xiamen (CN); Wei Jiang, Xiamen (CN); Zhiwei Lin, Xiamen (CN); Xiangjing Zhuo, Xiamen (CN); Tianzu Fang, Xiamen (CN); Yang Wang, Xiamen (CN); Jichu Tong, Xiamen (CN)

(73) Assignee: Xiamen Changelight Co., Ltd., Xiamen, Fujian Province (CN)

( * ) Notice: Subject to any disclaimer, the term of this patent is extended or adjusted under 35 U.S.C. 154(b) by 0 days.

(21) Appl. No.: 15/432,226

(22) Filed: Feb. 14, 2017

(65) Prior Publication Data
US 2017/0256404 A1 Sep. 7, 2017

(30) Foreign Application Priority Data

Mar. 2, 2016 (CN) .......................... 2016 1 0117134

(51) Int. Cl.
*H01L 21/02* (2006.01)
*H01L 31/0392* (2006.01)
(Continued)

(52) U.S. Cl.
CPC ...... *H01L 21/02507* (2013.01); *C30B 25/183* (2013.01); *C30B 29/406* (2013.01);
(Continued)

(58) Field of Classification Search
CPC ......... H01L 21/02458; H01L 21/02461; H01L 21/02463; H01L 21/02466;
(Continued)

(56) References Cited

U.S. PATENT DOCUMENTS 7,312,480 B2   12/2007  Hata et al.
8,735,938 B2   5/2014   Ooshika et al.
(Continued)

FOREIGN PATENT DOCUMENTS

CN   205406555 U    7/2016
JP   H09-043000 A   2/1997

OTHER PUBLICATIONS

Non-Final Office Action in U.S. Appl. No. 15/432,168, dated Oct. 6, 2017.
(Continued)

*Primary Examiner* — Allen Parker
*Assistant Examiner* — Wasiul Haider
(74) *Attorney, Agent, or Firm* — Foley & Lardner LLP; Cliff Z. Liu; Yiming Zhang

(57) ABSTRACT

Disclosed is a wafer or a material stack for semiconductor-based optoelectronic or electronic devices that minimizes or reduces misfit dislocation, as well as a method of manufacturing such wafer of material stack. A material stack according to the disclosed technology includes a substrate; a basis buffer layer of a first material disposed above the substrate; and a plurality of composite buffer layers disposed above the basis buffer layer sequentially along a growth direction. The growth direction is from the substrate to a last composite buffer layer of the plurality of composite buffer layers. Each composite buffer layer except the last composite buffer layer includes a first buffer sublayer of the first material, and a second buffer sublayer of a second material disposed above the first buffer sublayer. The thicknesses of the first buffer sublayers of the composite buffer layers decrease along the growth direction.

20 Claims, 5 Drawing Sheets

(51) Int. Cl.
*H01L 33/12* (2010.01)
*C30B 29/40* (2006.01)
*C30B 25/18* (2006.01)

(52) U.S. Cl.
CPC ...... *H01L 21/0254* (2013.01); *H01L 21/0262* (2013.01); *H01L 21/02458* (2013.01); *H01L 21/02461* (2013.01); *H01L 21/02463* (2013.01); *H01L 21/02466* (2013.01); *H01L 21/02505* (2013.01); *H01L 31/0392* (2013.01); *H01L 33/12* (2013.01); *H01L 21/02455* (2013.01); *Y02E 10/50* (2013.01)

(58) Field of Classification Search
CPC ......... H01L 21/02381; H01L 21/02505; H01L 29/155; H01L 29/2003; H01L 33/12
USPC ........................................ 257/190
See application file for complete search history.

(56) References Cited

U.S. PATENT DOCUMENTS 9,214,339 B2 12/2015 Okuno et al.
2002/0094002 A1 7/2002 Amano et al.
2008/0203382 A1* 8/2008 Yanagihara ....... H01L 21/02381
 257/18
2010/0237387 A1 9/2010 Sato
2010/0244096 A1 9/2010 Sato
2011/0272665 A1 11/2011 Yamaguchi et al.
2013/0181188 A1* 7/2013 Ooshika .................. H01L 29/15
 257/13
2014/0008661 A1 1/2014 Iwami et al.
2014/0264363 A1 9/2014 Zhu et al.
2016/0126099 A1* 5/2016 Shikauchi ............... H01L 29/36
 257/655
2017/0236711 A1* 8/2017 Shikauchi ......... H01L 21/02658
2017/0256403 A1 9/2017 Chen et al.
2017/0263819 A1 9/2017 Xu et al.

OTHER PUBLICATIONS

Final Office Action in U.S. Appl. No. 15/432,168, dated Apr. 2, 2018.

* cited by examiner

BUFFER LAYERS HAVING COMPOSITE STRUCTURES

CROSS-REFERENCE TO RELATED APPLICATION

This application claims the priority benefits of Chinese patent application serial no. 201610117134.0, filed on Mar. 2, 2016. The entirety of the above-mentioned patent application is hereby incorporated by reference herein and made a part of this specification.

BACKGROUND

In semiconductor industry, it is common to use wafers to fabricate various types of electronic product devices such as integrated circuits (ICs), solar cells and light-emitting diodes (LEDs). A wafer is a thin slice of semiconductor material. Microelectronic devices are built in or over the wafer by applying micro-fabrication processes such as doping, ion implantation, etching, deposition and photolithography. Then, the circuits on the wafer are separated by a process called dicing and packaged.

Particularly, an epitaxial wafer is a high quality wafer made by an epitaxial growth process. During the epitaxial growth process, one or more crystalline overlayers (referred to as epitaxial layers) are deposited on a crystalline substrate. The crystalline substrate serves as a seed crystal. The crystalline overlayer forms an ordered crystal orientation with respect to the crystal structure of the crystalline substrate. The epitaxial layers and the substrate can have the same material (homoepitaxy) or different material (heteroepitaxy).

SUMMARY

Introduced here is a wafer or a material stack for semiconductor-based optoelectronic or electronic devices that minimizes or reduces misfit dislocation, as well as a method of manufacturing such wafer of material stack (collectively and individually, the "technology introduced here" or "disclosed technology"). The material stack includes a substrate; a basis buffer layer of a first material disposed above the substrate; and a plurality of composite buffer layers disposed above the basis buffer layer sequentially along a growth direction. The growth direction is from the substrate to a last composite buffer layer of the plurality of composite buffer layers. Each composite buffer layer except the last composite buffer layer includes a first buffer sublayer of the first material, and a second buffer sublayer of a second material disposed above the first buffer sublayer. The thicknesses of the first buffer sublayers of the composite buffer layers decrease along the growth direction. In some embodiments, the thickness ratios of the composite buffer layers increase along the growth direction. The thickness ratio is defined as a ratio of a thickness of the second buffer sublayer to a thickness of the first buffer sublayer within the same composite buffer layer. In yet some embodiments, the lattice constants of the second buffer sublayers of the composite buffer layers increase along the growth direction.

In some embodiments, a method of manufacturing a semiconductor-based wafer for reducing misfit dislocation is introduced. The method includes steps of depositing a basis buffer layer of aluminum nitride (AlN) on a substrate; forming an AlN sublayer of a composite buffer layer on the basis buffer layer by supplying pulses of reactants for AlN for a first total pulse time period; forming an gallium nitride (GaN) sublayer of the composite buffer layer on the AlN sublayer by supplying pulses of reactants for GaN for a second total pulse time period; and growing additional composite buffer layers along a growth direction from the substrate to the composite buffer layers, by repeating steps of forming the AlN sublayer and forming the GaN sublayer. The first total pulse time period for each AlN sublayer decreases among the composite buffer layers along the growth direction.

Other aspects of the disclosed embodiments will be apparent from the accompanying figures and detailed description.

This Summary is provided to introduce a selection of concepts in a simplified form that are further explained below in the Detailed Description. This Summary is not intended to identify key features or essential features of the claimed subject matter, nor is it intended to be used to limit the scope of the claimed subject matter.

BRIEF DESCRIPTION OF THE DRAWINGS

One or more embodiments of the present disclosure are illustrated by way of example and not limitation in the figures of the accompanying drawings, in which like references indicate similar elements.

DETAILED DESCRIPTION

Figure 1:
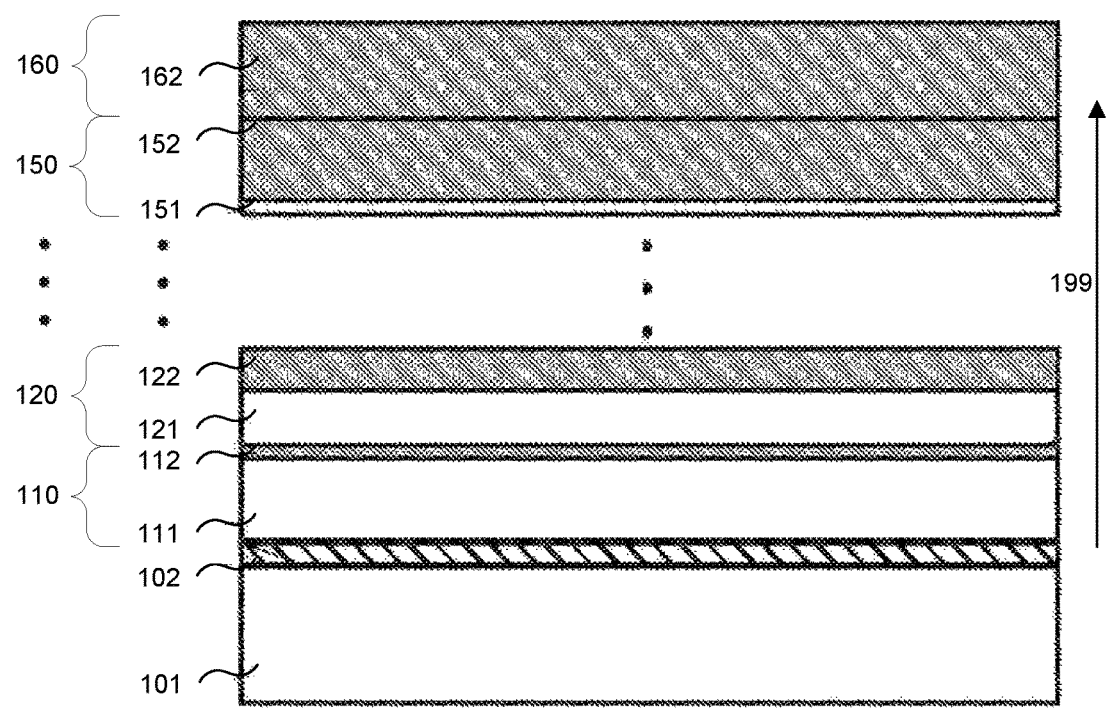
FIG. 1 schematically illustrates a wafer having composite buffer layers.

In this description, references to "an embodiment," "one embodiment" or the like mean that the particular feature, function, structure or characteristic being described is included in at least one embodiment introduced here. Occurrences of such phrases in this specification do not necessarily all refer to the same embodiment. On the other hand, the embodiments referred to also are not necessarily mutually exclusive.

An epitaxial wafer can include one or more epitaxial layers of various materials. For example, an epitaxial wafer can include a Gallium Nitride (GaN) epitaxial layer deposited on a crystalline substrate of a different material (e.g., sapphire, silicon carbide, silicon, etc.). The deposition can be achieved by, e.g., a metal-organic chemical vapor deposition (MOCVD) process. To achieve a high quality GaN epitaxial layer, a buffer layer (e.g., GaN or Aluminum Nitride (AlN)) can be deposited between the crystalline substrate and the GaN epitaxial layer. For example, a physical vapor deposition (PVD) process can build a uniform and dense AlN buffer layer that bonds strongly to the substrate. U.S. Patent Publication 2014/02644363 discloses a PVD process of making AlN film with a X-ray diffraction (XRD) full width at half maximum (FWHM) of less than 15 arcsec and a surface roughness of less than 2 nanometers (nm).

After deposition of the buffer layer, the actual epitaxial layer is deposited on top of the buffer layer. For example, a GaN epitaxial layer can be built on top of an AlN buffer layer via, e.g. MOCVD. However, crystals of different materials can have lattice mismatch between each other. A GaN crystal and an AlN crystal can have a lattice mismatch of 2.5%. If the GaN epitaxial layer is deposited directly on the AlN buffer layer, the lattice mismatch causes a stress between the layers of two different materials. The stress increases gradually as the thickness of the GaN epitaxial layer increases, until the GaN thickness exceeds a critical thickness. Once the GaN thickness exceeds a critical thickness, the stress is released by misfit dislocations that cause missing or dangling bonds. Such misfit dislocations in the GaN epitaxial layer significantly decrease the performance and lifetime of product devices made from the wafer.

According to at least some embodiments of the disclosed technology, to avoid misfit dislocations in the epitaxial layer (e.g., GaN) and to improve the performance and lifetime of the product devices, a wafer (also referred to as material stack) including multiple buffer layers having composite structures (also referred to as composite buffer layers) is disclosed herein. Each composite buffer layer includes at least two layers of different materials, i.e., a transitional material and a target material. The transitional material (e.g., AlN) refers to a material that is included in the basis buffer layer at the bottom of the wafer. The target material (GaN) refers to the main material that is included in the top layer(s) of the composite buffer layers.

As the composite buffer layers are built on top of the substrate, the thickness ratio of the transitional material to the target material decreases along the growth direction, as the composite buffer layers are placed closer to a top of the wafer. As a result, the top composite buffer layer includes only the target material and has a relaxed lattice constant.

Such composite buffer layers modulate the stress in the epitaxial layers (e.g., GaN layers and AlN layers). Thus, the target material in the top composite buffer layer (as well as layers above the top composite buffer layer) has no (or at least reduced) misfit dislocations caused by lattice mismatch. The thickness of each epitaxial layer can be accurately controlled to improve the surface mobility of the atoms. Each epitaxial layer has a flat surface and a uniform thickness. As a result, product devices, which are manufactured from the wafer, can have an improved performance and lifetime.

FIG. 1 schematically illustrates a wafer having composite buffer layers, according to various embodiments of the technology. The wafer 100 includes a substrate 101, a basis buffer layer 102 and multiple composite buffer layers 110-160. The composite buffer layers 110-1N0 (N being the total number of the composite buffer layers) can include any number of layers. The basis buffer layer 102 (e.g., an AlN buffer layer) can be deposited on the substrate 101. The basis buffer layer 102 can be deposited using methods such as PVD, MOCVD, hydride vapor phase epitaxy (HVPE), atomic layer deposition (ALD), etc. The basis buffer layer 102 includes a transitional material (e.g., AlN).

The first composite buffer layer 110 is deposited on the basis buffer layer 102. The composite buffer layer 110 includes two layers 111, 112 of different materials. The layer 111 includes the transitional material (e.g., AlN), which is the same as the material of the basis buffer layer 102. The layer 112 is on top of the layer 111 and includes a target material (e.g., GaN).

Similarly, the second composite buffer layer 120 includes a layer 121 of the transitional material and a layer 122 of the target material, and so on. In this order, the nth composite buffer layer 1n0 includes a layer 1n1 (also referred to as transitional buffer layer or transitional buffer sublayer) of the transitional material (e.g., AlN) and a layer 1n2 (also referred to as target buffer layer or target buffer sublayer) of the target material (e.g., GaN). In some other embodiments, the total number N of the composite buffer layers 110-1N0 can be any integer.

Along the epitaxial growth direction 199 as illustrated in FIG. 1, the thickness of a composite buffer layer 1n0 is denoted by T(n). Inside the composite buffer layer 1n0, the thickness of the transitional buffer layer 1n1 of the transitional material is denoted by A(n), and the thickness of the target buffer layer 1n2 of the target material is denoted by B(n). Thus, the relationship between T(n), A(n) and B(n) satisfies: T(n)=A(n)+B(n). In other words, T(1)=A(1)+B(1), T(2)=A(2)+B(2), . . . T(N)=A(N)+B(N); N is the total number of the composite buffer layers.

In an embodiment illustrated in FIG. 1, to modulate the stress among the composite buffer layers, the wafer 100 is designed such that the composite buffer layers 110-1N0 have the same thickness. In other words, T(1)=T(2)= . . . =T(N). In some other embodiments, the composite buffer layers do not have the same thickness.

For each transitional buffer layer 1n1 of the transitional material (e.g., AlN), the thickness of the transitional buffer layer 1n1 is more than the thickness of the next transitional buffer layer on top. In other words, the thicknesses of the transitional buffer layers of the transitional material decrease along the growth direction, as the composite buffer layers are placed closer to a top of the wafer 100. A(1)>A(2)> . . . A(N). Furthermore, the thickness of each transitional buffer layer 1n1 is less than a critical thickness $A_c$ for the transitional material (e.g., AlN), at which the stress is fully released by atomic dislocations. In other words, $A(1)<A_c$, $A(2)<A_c$, . . . $A(N)<A_c$.

For each target buffer layer 1n2 of the target material (e.g., GaN), the thickness of the target buffer layer 1n2 is less than the thickness of the next target buffer layer on top. In other words, the thicknesses of the target buffer layers increase along the growth direction, as the composite buffer layers are placed closer to a top of the wafer 100. B(1)<B(2)< . . . B(N). Furthermore, the thickness of each target buffer layer 1n2 is less than a critical thickness $B_c$ for the target material (e.g., GaN), at which the stress is fully released by atomic dislocations. In other words, $B(1)<B_c$, $B(2)<B_c$, . . . $B(N)<B_c$.

Along the epitaxial growth direction 199, the transitional buffer layers and the target buffer layers grow (e.g., being deposited) alternatively on top of each other. The thicknesses of the layers satisfy the conditions of: T(1)=T(2)= . . . =T(N); A(1)>A(2)> . . . A(N); and B(1)<B(2)< . . . B(N). The thicknesses of the transitional buffer layers decrease along the epitaxial growth direction 199, until the thickness of the transitional buffer layer 161 of the top composite buffer layer 160 reaches zero. In other words, the top composite buffer layer 160 only includes a target buffer layer 162 and does not contain transitional material.

Additionally, the wafer 100 can be used to manufacture various types of product devices by depositing more layers on top of the composite buffer layers 110-1N0. For example, an epitaxial structure of a semiconductor component can be formed by depositing on the wafer 100 multiple functional layers including, e.g., a first-type conductive layer, an active layer, an electron-blocking layer, a second-type conductive layer. In some embodiments, one or more of the functional layers can include the target material (e.g., GaN).

The composite buffer layers of the embodiment illustrated in FIG. 1 satisfy all five conditions: T(1)=T(2)= . . . =T(N); A(1)>A(2)> . . . A(N); A(1)<$A_c$, A(2)<$A_c$, . . . A(N)<$A_c$; B(1)<B(2)< . . . B(N); and B(1)<$B_c$, B(2)<$B_c$, . . . B(N)<$B_c$. In some embodiments according to the disclosed technology, the composite buffer layers do not necessarily satisfy all five conditions. For example, in some embodiments, the thicknesses of the transitional buffer sublayers of the composite buffer layers decrease along the growth direction. In some other embodiments, the thicknesses of the target buffer sublayers of the composite buffer layers increase along the growth direction. In yet some embodiments, the thickness ratios of the composite buffer layers increase along the growth direction. A thickness ratio of a specific composite buffer layer is defined as a ratio of a thickness of the target buffer sublayer to a thickness of the transitional buffer sublayer.

Although various embodiments according to the disclosed technology use AlN and GaN as samples of the materials used in the composite buffer layers, a person having ordinary skill in the art readily appreciates that the technology can be applied to any types of semiconductor materials (e.g., III-V semiconductors). For example, the transitional material or the target material can be gallium nitride (GaN), aluminum nitride (AlN), indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.).

Figure 2A:
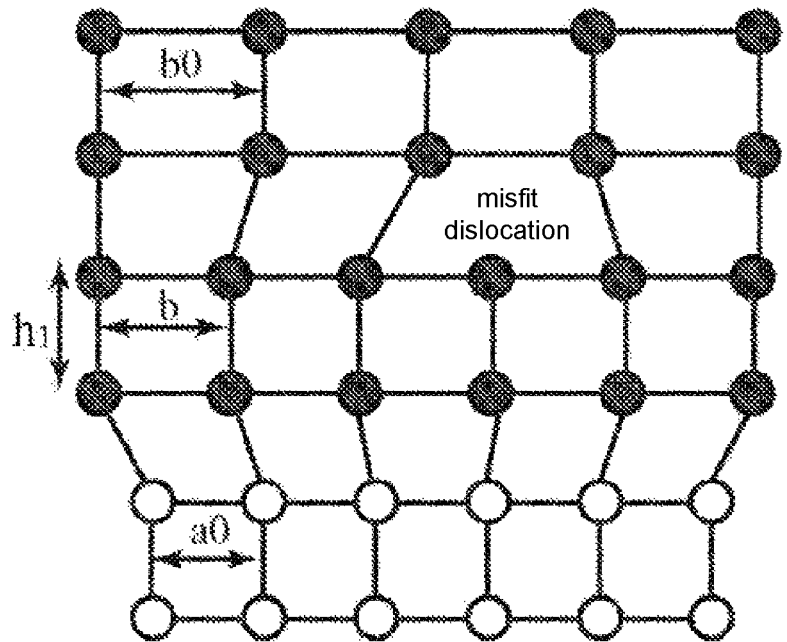
FIG. 2A schematically illustrates an example of misfit dislocations caused by mismatch of lattice parameters of different materials.
Figure 2B:
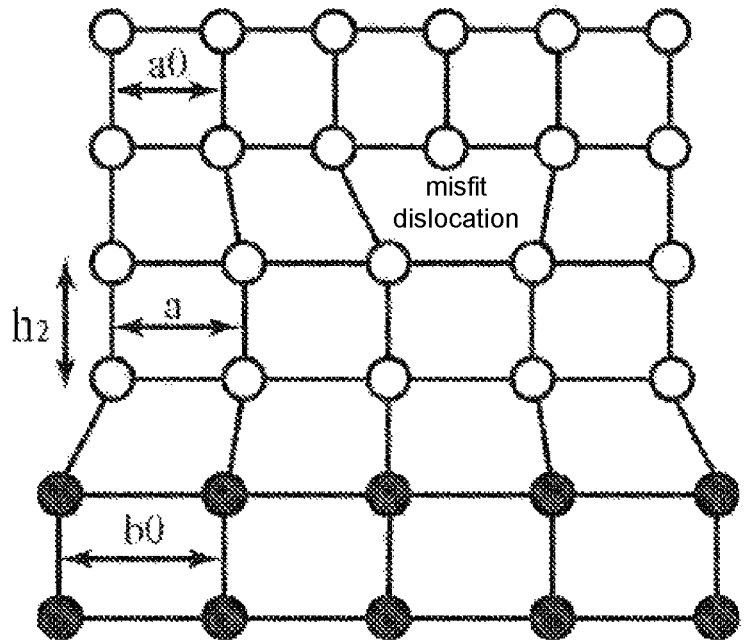
FIG. 2B schematically illustrates another example of misfit dislocations caused by mismatch of lattice parameters of different materials.
Figure 3:
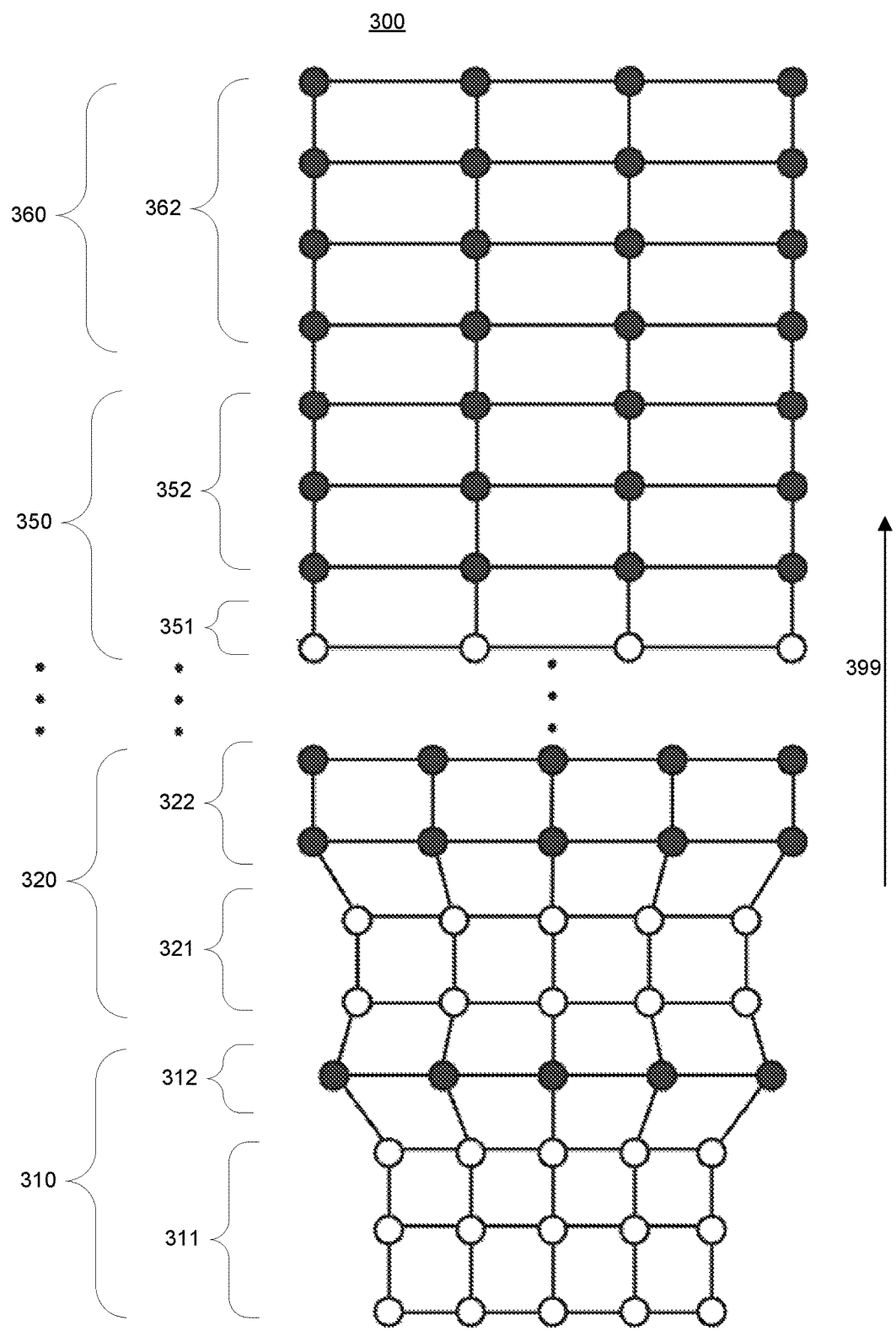
FIG. 3 schematically illustrates an example of composite nitride buffer layers that avoid the issue of misfit dislocation.

To illustrate that the composite buffer layers of FIG. 1 solve (or at least minimize or reduce) the issue of misfit dislocation, the causation of misfit dislocation is discussed herein. FIGS. 2A and 2B illustrate the issue of misfit dislocation; FIG. 3 shows how the disclosed technology solves the issue. FIG. 2A schematically illustrates an example of misfit dislocations caused by mismatch of lattice parameters of different materials. FIG. 2A shows that GaN is grown directly on top of AlN, without any composite buffer layers in the middle. The white dots in FIG. 2A represent atoms of a first material of AlN; the black dots in FIG. 2A represent atoms of a second material of GaN. As shown in FIG. 2A, the in-plane lattice constant of AlN in the relaxed state is a0. The in-plane lattice constant of GaN in the relaxed state is b0. The in-place lattice constant of AlN a0 is less than the in-place lattice constant of GaN b0.

If GaN is epitaxially grown directly on top of AlN, the portion of GaN along the growth plane will try to match its actual in-plane lattice constant b with the in-plane lattice constant of AlN a0. Assuming the thickness of the GaN is less than the critical thickness, the actual in-plane lattice constant b is between a0 and b0: a0<b<b0. Due to the reduced lattice constant b (comparing to b0), the lattice for the portion of GaN in proximity to the growth plane is compressed, which causes a compressive stress in the GaN material.

The compressive stress increases as the thickness of the GaN increases. When the thickness of GaN reaches or exceeds the critical thickness $h_1$, the compressive stress reaches its peak value. As a result, the lattice of GaN can no longer continue sustaining the compressive stress and releases the compressive stress by misfit dislocations. After releasing the compressive stress, the lattice of GaN is then in a relaxed state. In other words, the actual in-plane lattice constant b after misfit dislocations equals the in-plane lattice constant at the relaxed state b0.

Similarly, FIG. 2B schematically illustrates another example of misfit dislocations caused by mismatch of lattice parameters of different materials. FIG. 2B shows that AlN is grown directly on top of GaN, without composite buffer layers in the middle. Again, the white dots in FIG. 2B represent atoms of AlN; the black dots in FIG. 2B represent atoms of GaN. The in-plane lattice constant of AlN in the relaxed state is a0. The in-plane lattice constant of GaN in the relaxed state is b0, where a0<b0.

If AlN is epitaxially grown directly on top of GaN, the portion of AlN along the growth plane will try to match its actual in-plane lattice constant a with the in-plane lattice constant of GaN b0. Assuming the thickness of the AlN is less than the critical thickness, the actual in-plane lattice constant a is between a0 and b0: a0<a<b0. Due to the increased lattice constant a (comparing to a0), the lattice for the portion of AlN in proximity to the growth plane is expanded, which causes a tensile stress in the AlN material.

The tensile stress increases as the thickness of the AlN increases. When the thickness of AlN reaches or exceeds the critical thickness $h_2$, the tensile stress reaches its peak value. As a result, the lattice of AlN can no longer continue sustaining the tensile stress and releases the tensile stress by misfit dislocations. After releasing the tensile stress, the lattice of AlN is then in a relaxed state. In other words, the actual in-plane lattice constant a after misfit dislocations equals the in-plane lattice constant at the relaxed state a0.

As shown in FIGS. 2A and 2B, the thickness of GaN or AlN needs to be less than the critical thickness of the corresponding material to avoid the issue of misfit dislocation in the lattice of GaN or AlN. As a solution to the issue, the composite buffer layers as illustrated in FIGS. 1 and 3 can avoid or reduce the misfit dislocation. FIG. 3 schematically illustrates an example of composite nitride buffer layers that avoid the issue of misfit dislocation.

As illustrated in FIG. 3, each composite nitride buffer layer includes an AlN buffer layer (as a transitional buffer layer, also called transitional buffer sublayer) and a GaN buffer layer (as a target buffer layer, also called target buffer sublayer). The AlN buffer layers and GaN buffer layers grow alternatively on top of each other. Except the AlN buffer layer at the bottom composite buffer layer, each AlN buffer layer is sandwiched by two GaN buffer layers.

For example, as shown in FIG. 3, the second AlN buffer layer 321 is sandwiched by the first GaN buffer layer 312 and second GaN buffer layer 322. Because the in-plane lattice constant of GaN is larger than the in-place lattice constant of AlN, the first GaN buffer layer 312 and second GaN buffer layer 322 apply tensile stress to the second AlN buffer layer 321 that is sandwiched in between. The tensile stress causes the in-place lattice constant of the second AlN buffer layer 321 to increase. Since the thickness of the second AlN buffer layer 321 is less than the critical thickness, the tensile stress applied on the second AlN buffer layer 321 cannot be fully released by misfit dislocation.

Along the epitaxial growth direction 399, the thickness of an AlN buffer layer of each specific composite buffer layer is less than the thickness of another AlN buffer layer of another composite buffer layer that is immediately below the specific composite buffer layer. Furthermore, the thickness of a GaN buffer layer of each specific composite buffer layer is more than the thickness of another GaN buffer layer of another composite buffer layer that is immediately below the specific composite buffer layer.

The tensile stress on the second AlN layer 321 is more than the tensile stress on the first AlN layer 311. The tensile stress on the nth AlN layer is more than the tensile stress on the (n−1)th AlN layer. In other words, the tensile stress on the AlN buffer layers increases as the number of composite buffer layers increases. As a result, the lattice constant of the AlN buffer layers increases as the number of composite buffer layers increases.

In the (N−1)th composite buffer layer 350, the lattice constant of the (N−1)th AlN layer 351 is stretched to substantially equal to the lattice constant of GaN at a relaxed state. As a consequence, the (N−1)th GaN layer 352, which is immediately on top of the AlN layer 351, is also at a relaxed state. In the Nth composite buffer layer 360, the thickness of the Nth AlN layer 361 is zero. In other words, the Nth composite buffer layer 360 does not contain AlN and only contains the Nth GaN layer 362. The Nth GaN layer 362, which is on top of the relaxed GaN layer 352, is also at a relaxed state.

According to some embodiments, a method of manufacturing the composite buffer layers is disclosed. In order to avoid or reduce misfit dislocations in the mismatched epitaxial layers which affect the performance and lifetime of the epitaxial wafer, a pulse method can be used to inject chemicals to form layers of first and second materials (e.g., AlN and GaN) for the composite buffer layers. A second composite buffer layer is formed on top of the first composite buffer layer, and so on. By adjusting the pulse time periods, the second composite buffer layer has a thinner layer of the first material than the first composite buffer layer. The second composite buffer layer also has a thicker layer of the second material than the first composite buffer layer. More composite buffer layers are built on top with decreasing amount of first material (by adjusting pulse periods) until the last layer includes only the second material, which has a relaxed lattice constant.

Figure 4:
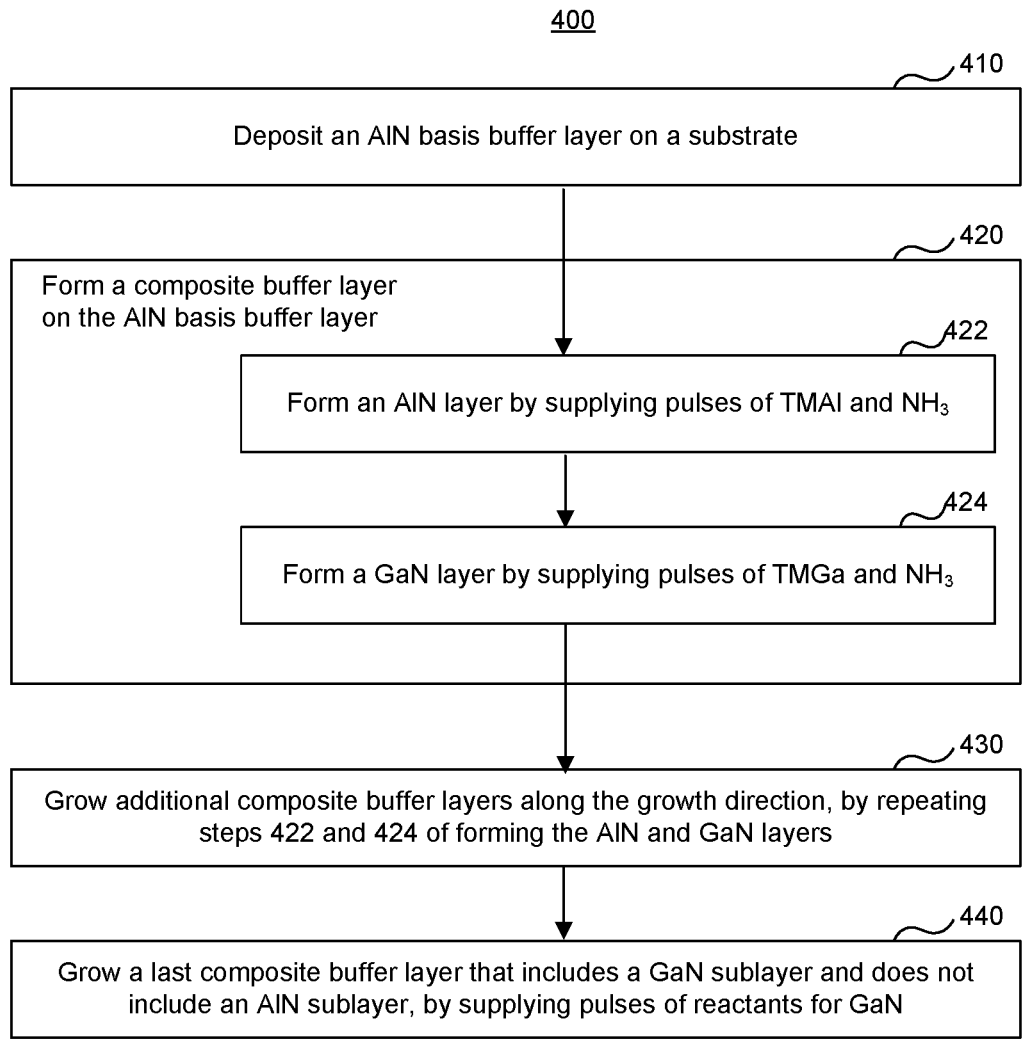
FIG. 4 illustrates a sample process of manufacturing the composite buffer layers.

FIG. 4 illustrates a sample process of manufacturing the composite buffer layers. At step 410, the method deposits an AlN basis buffer layer (e.g., layer 102) on a substrate (e.g., substrate 101). The AlN basis buffer layer can be deposited using methods such as PVD, MOCVD, HVPE, ALD, etc.

Figure 5:
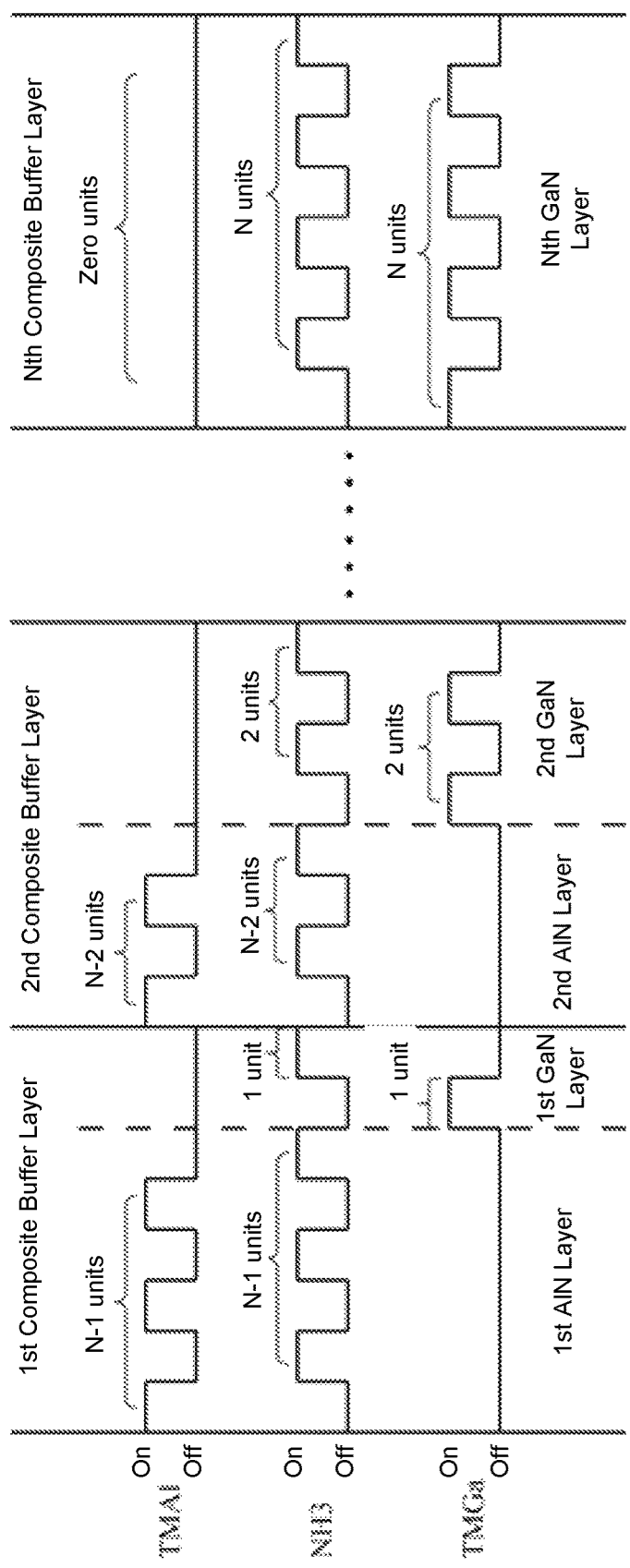
FIG. 5 illustrates time periods of supplying pulses of chemical reactants for manufacturing the composite buffer layers.

Then, at step 420, the method forms a first composite buffer layer (e.g., composite buffer layer 110 or 310) on the AlN basis buffer layer. The first composite buffer layer includes a first AlN layer (e.g., layer 111 or 311) and a first GaN layer (e.g., layer 112 or 312). The step 420 includes sub-steps 422 and 424. At sub-step 422, when growing the first AlN layer of the first composite buffer layer, the method supplies pulses of trimethylaluminum (TMAI) and ammonia ($NH_3$). The total period of the pulses is N−1 units of time. FIG. 5 illustrates the time periods of supplying the pulses of TMAI, ammonia and TMGa for manufacturing the composite buffer layers. After finishing the first AlN layer, at sub-step 424, the method further supplies pulses of trimethylgallium (TMGa) and ammonia, to form the first GaN layer of the first composite buffer layer. The total period of the pulses is 1 unit of time.

Next, at step 430, the method grows additional composite buffer layers along the growth direction, by repeating steps 422 and 424 of forming the AlN and GaN layers. For example, the method grows a second composite buffer layer (e.g., composite buffer layer 120 or 320) on the first composite buffer layer. The second composite buffer layer includes a second AlN layer (e.g., layer 121 or 321) and a second GaN layer (e.g., layer 122 or 322). When growing the second AlN layer of the second composite buffer layer, the method supplies pulses of TMAI and ammonia. The total period of the pulses is N−2 units. After finishing the second AlN layer, the method further supplies pulses of TMGa and ammonia, to form the second GaN layer of the second composite buffer layer. The total period of the pulses is 2 units. For the next composite buffer layer, the total period for the AlN layer is further reduced and the total period for the GaN layer is further increased, and so on. The method grows more composite buffer layer sequentially on top of the deposited composite buffer layers.

In some embodiments, for each specific composite buffer layer, the method uses pulses of TMAI or TMGa and ammonia to form the AlN layer and GaN layer. For depositing an AlN layer of a specific composite buffer layer, the total pulse period for the TMAI and ammonia pulses is one time unit less than the total pulse period for depositing another AlN layer of an immediately previous composite buffer layer. For depositing a GaN layer of a specific composite buffer layer, the total pulse period for the TMGa and ammonia pulses is one time unit more than the total pulse period for depositing another GaN layer of an immediately previous composite buffer layer.

At the (N−1)th composite layer, to form the (N−1)th AlN layer of the (N−1)th composite buffer layer, the method supplies pulses of TMAI and ammonia for a total time period of 1 unit of time. To form the (N−1)th GaN layer of the (N−1)th composite buffer layer, the method supplies pulses of TMGa and ammonia for a total time period of (N−1) units of time.

At step 440, the method grows a last composite buffer layer that includes a GaN sublayer and does not include an AlN sublayer, by supplying pulses of reactants for GaN. For example, as illustrated in FIG. 5, at the Nth composite layer (which is the last composite layer), to form the Nth AlN layer of the Nth composite buffer layer, the method supplies pulses of TMAI and ammonia for a zero period of time. In other words, the thickness of the Nth AlN layer is zero. To form the Nth GaN layer of the Nth composite buffer layer, the method supplies pulses of TMGa and ammonia for a total time period of N units of time.

Although the pulse time periods in the embodiment illustrated in FIGS. 4 and 5 are adjusted by an integer number of time units, in some alternative embodiments, the differences of the pulse time periods can vary. For example, in an embodiment, the total pulse time period for each AlN sublayer decreases among the composite buffer layers along the growth direction. Also, the total pulse time period for each GaN sublayer increases among the composite buffer layers along the growth direction. As a result, the thicknesses of the AlN buffer sublayers of the composite buffer layers decrease along the growth direction, and the thicknesses of the GaN buffer sublayers of the composite buffer layers increase along the growth direction. Such a composite structure achieves a relaxed GaN layer at the last composite buffer layer without introducing any misfit dislocation.

Although various embodiments of FIGS. 4 and 5 use AlN and GaN as samples of the materials used in the composite buffer layers, a person having ordinary skill in the art readily appreciates that the technology can be applied to any types of semiconductor materials (e.g., III-V semiconductors). For example, the transitional material or the target material can be gallium nitride (GaN), aluminum nitride (AlN), indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.). The reactants used in the pulses can include trimethylgallium (TMGa), triethylgallium (TEGa), trimethylaluminum (TMAl), triethylaluminium (TEA), trimethylindium (TMIn), triethylindium (TEIn), ammonia ($NH_3$), arsine ($AsH_3$), tertiarybutylarsine (TBAs), phosphine ($PH_3$), tertiarybutylphosphine (TBP), or trimethylantimony (TMSb), etc.

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that (i) the methods/steps described herein may be performed in any sequence and/or in any combination, and that (ii) the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. A material stack for semiconductor-based optoelectronic or electronic devices, comprising:
    a substrate;
    a basis buffer layer of a first material disposed above the substrate; and
    a plurality of composite buffer layers disposed above the basis buffer layer sequentially along a growth direction from the substrate to a last composite buffer layer of the plurality of composite buffer layers, each composite buffer layer except the last composite buffer layer including:
        a first buffer sublayer of the first material, and
        a second buffer sublayer of a second material disposed above the first buffer sublayer;
    wherein thicknesses of the first buffer sublayers of the composite buffer layers decrease along the growth direction.

2. The material stack of claim 1, wherein thicknesses of the second buffer sublayers of the composite buffer layers increase along the growth direction.

3. The material stack of claim 1, wherein the basis buffer layer of the first material has a relaxed lattice constant for the first material, and the first buffer sublayer of a first composite buffer layer among the composite buffer layers has the relaxed lattice constant for the first material.

4. The material stack of claim 1, wherein the last composite buffer layer includes a buffer sublayer of the second material and does not include a buffer sublayer of the first material, and the buffer sublayer of the second material of the last composite buffer layer has a relaxed lattice constant for the second material.

5. The material stack of claim 1, wherein the first buffer sublayers and the second buffer sublayers of the composite buffer layers contain substantially no misfit dislocation due to lattice mismatch between the first material and the second material.

6. The material stack of claim 1, wherein first material is aluminum nitride (AlN) and the second material is gallium nitride (GaN).

7. The material stack of claim 6, wherein the plurality of composite buffer layers have the same thickness.

8. The material stack of claim 7, wherein the thickness of the first buffer sublayer of each composite buffer layer is less than a critical thickness of the first material at which stress is fully released by misfit dislocation.

9. The material stack of claim 7, wherein thickness of the second buffer sublayer of each composite buffer layer is less than a critical thickness of the second material at which stress is fully released by misfit dislocation.

10. The material stack of claim 7, further comprising:
    one or more functional layers above the last composite buffer layer, the one or more functional layers including a conductive layer, an active layer, or an electron-blocking layer.

11. The material stack of claim 1, wherein the first material is a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements; and the second material is a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements.

12. An optoelectronic or electronic device, comprising:
    a substrate;
    a basis buffer layer of a first material disposed above the substrate; and
    a plurality of composite buffer layers disposed above the basis buffer layer sequentially along a growth direction from the substrate to a last composite buffer layer of the plurality of composite buffer layers, each specific composite buffer layer except the last composite buffer layer including:
        a first buffer sublayer of the first material, and
        a second buffer sublayer of a second material disposed above the first buffer sublayer, the specific composite buffer layer having a thickness ratio that is a ratio of a thickness of the second buffer sublayer to a thickness of the first buffer sublayer;
    wherein the thickness ratios of the composite buffer layers increase along the growth direction.

13. The device of claim 12, wherein lattice constants of the second buffer sublayers of the composite buffer layers increase along the growth direction.

14. The device of claim 12, wherein the first buffer sublayer of a first composite buffer layer among the composite buffer layers has a relaxed lattice constant for the first material, and the second buffer sublayer of the first composite buffer layer has a lattice constant that is between the relaxed lattice constant for the first material and a relaxed lattice constant for the second material.

15. The device of claim 12, wherein the last composite buffer layer includes a buffer sublayer of the second material and does not include a buffer sublayer of the first material, and the buffer sublayer of the second material of the last composite buffer layer has a relaxed lattice constant for the second material.

16. The device of claim 12, wherein the thickness of the first buffer sublayer of each composite buffer layer is less than a critical thickness of the first material at which stress is fully released by misfit dislocation, and the thickness of the second buffer sublayer of each composite buffer layer is less than a critical thickness of the second material at which stress is fully released by misfit dislocation.

17. The device of claim 12, wherein the thicknesses of the first buffer sublayers of the composite buffer layers decrease along the growth direction.

18. A wafer for semiconductor-based optoelectronic or electronic devices, comprising:
   a substrate;
   a basis buffer layer of a first material disposed above the substrate; and
   a plurality of composite buffer layers disposed above the basis buffer layer sequentially along a growth direction from the substrate to a last composite buffer layer of the plurality of composite buffer layers, each composite buffer layer except the last composite buffer layer including:
      a first buffer sublayer of the first material, and
      a second buffer sublayer of a second material disposed above the first buffer sublayer;
   wherein lattice constants of the second buffer sublayers of the composite buffer layers increase along the growth direction.

19. The wafer of claim 18, wherein the last composite buffer layer includes a buffer sublayer of the second material and does not include a buffer sublayer of the first material, and the buffer sublayer of the second material of the last composite buffer layer has a relaxed lattice constant for the second material.

20. The wafer of claim 18, wherein lattice constants of the first buffer sublayers of the composite buffer layers increase along the growth direction.

\* \* \* \* \*